United States Patent
Kim et al.

(10) Patent No.: US 9,645,444 B2
(45) Date of Patent: May 9, 2017

(54) INVERSE WAVELENGTH DISPERSION RETARDATION FILM AND DISPLAY DEVICE INCLUDING THE SAME

(71) Applicant: SAMSUNG ELECTRONICS CO., LTD., Suwon-si, Gyeonggi-do (KR)

(72) Inventors: Hyung Jun Kim, Suwon-si (KR); Ji-Hoon Lee, Suwon-si (KR); Myung Sup Jung, Seongnam-si (KR); Won-Cheol Jung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 47 days.

(21) Appl. No.: 14/154,630

(22) Filed: Jan. 14, 2014

(65) Prior Publication Data
US 2014/0347613 A1  Nov. 27, 2014

(30) Foreign Application Priority Data
May 27, 2013  (KR) ........................ 10-2013-0059703

(51) Int. Cl.
*G02F 1/13363* (2006.01)
*F21V 9/14* (2006.01)
(Continued)

(52) U.S. Cl.
CPC ............ *G02F 1/13363* (2013.01); *F21V 9/14* (2013.01); *G02B 5/3016* (2013.01);
(Continued)

(58) Field of Classification Search
None
See application file for complete search history.

(56) References Cited

U.S. PATENT DOCUMENTS

| 6,812,983 B2 | 11/2004 | Arakawa |
| 7,283,188 B2 | 10/2007 | Su Yu et al. |

(Continued)

FOREIGN PATENT DOCUMENTS

| JP | 2004004847 A | 1/2004 |
| JP | 2008020670 | 1/2008 |

(Continued)

OTHER PUBLICATIONS

Extended European Search Report—EP Application No. 14164152.2 dated Aug. 19, 2014.

*Primary Examiner* — Anthony J Frost
(74) *Attorney, Agent, or Firm* — Cantor Colburn LLP

(57) ABSTRACT

A retardation film including: a first optical anisotropic layer including a polymer material; and a second optical anisotropic layer including a liquid crystal material, in which the first optical anisotropic layer has refractive indices which satisfy the following inequation: $nz1 \geq nx1 > ny1$, the second optical anisotropic layer has refractive indices which satisfy the following inequation: $nx2 > ny2 \geq nz2$, a fast axis of the first optical anisotropic layer and a slow axis of the second optical anisotropic layer form a predetermined angle such that refractive indices of the retardation film satisfy the following inequation: $0 < (nx0-nz0)/(nx0-ny0) < 1$, and in-plane retardation values (Re0) of the retardation film respectively at a wavelength of about 450 nanometers, 550 nanometers and 650 nanometers satisfy the following inequation: $Re0\ (450\ nm) < Re0\ (550\ nm) < Re0\ (650\ nm)$.

18 Claims, 3 Drawing Sheets

(51) Int. Cl.
 *G02B 5/30* (2006.01)
 *H01L 51/52* (2006.01)

(52) U.S. Cl.
 CPC ..... *G02B 5/3083* (2013.01); *G02F 1/133634* (2013.01); *H01L 51/5275* (2013.01); *B32B 2457/202* (2013.01); *G02F 2001/133633* (2013.01); *G02F 2001/133637* (2013.01); *G02F 2001/133638* (2013.01); *G02F 2413/02* (2013.01); *G02F 2413/05* (2013.01); *G02F 2413/12* (2013.01)

(56) References Cited

U.S. PATENT DOCUMENTS

| | | |
|---|---|---|
| 8,085,370 B2 | 12/2011 | Joubert et al. |
| 2002/0005925 A1 | 1/2002 | Arakawa |
| 2002/0060762 A1 | 5/2002 | Arakawa |
| 2004/0051831 A1 | 3/2004 | Su Yu et al. |
| 2008/0200621 A1* | 8/2008 | Ohmori ................ C08F 216/38 525/472 |
| 2009/0040454 A1* | 2/2009 | Ichihashi et al. ............. 349/193 |
| 2010/0231830 A1* | 9/2010 | Hirakata et al. ................ 349/85 |
| 2011/0216271 A1* | 9/2011 | Suzuki et al. .................... 349/71 |
| 2012/0282838 A1 | 11/2012 | Kim |
| 2013/0044286 A1 | 2/2013 | Yoon et al. |

FOREIGN PATENT DOCUMENTS

| | | | |
|---|---|---|---|
| JP | 2008020670 A | * | 1/2008 |
| JP | 2009237534 A | | 10/2009 |
| KR | 1020010105255 A | | 11/2001 |
| KR | 1020020038550 A | | 5/2002 |

\* cited by examiner

INVERSE WAVELENGTH DISPERSION RETARDATION FILM AND DISPLAY DEVICE INCLUDING THE SAME

CROSS-REFERENCE TO RELATED APPLICATION

This application claims priority to Korean Patent Application No. 10-2013-0059703 filed on May 27, 2013, and all the benefits accruing therefrom under 35 U.S.C. §119, the content of which in its entirety is herein incorporated by reference.

BACKGROUND (a) Field

The disclosure relates to an optical film having an inverse wavelength dispersion retardation characteristic to a wavelength of light, and a display device including the optical film.

(b) Description of the Related Art

Various optical films are used in a display device such as a liquid crystal display device and an organic light emitting display. Among the optical films, an inverse wavelength dispersion retardation film having an inverse wavelength dispersion retardation characteristic to a wavelength of light may be used as a compensation film of the liquid crystal display device, a reflection reduction film of the organic light emitting display, or the like.

The inverse wavelength dispersion retardation film may be manufactured by bonding a polymer film having a positive birefringence value and a polymer film having a negative birefringence value (Korean Patent Laid-Open Publication No. 2001-0105255, Japanese Patent Laid-Open Publication No. 2009-237534, and Korean Patent Laid-Open Publication No. 2002-0038550), or by laminating a liquid crystal film having a positive birefringence value and a liquid crystal film having a negative birefringence value together (Japanese Patent Laid-Open Publication No. 2009-237534). However, the aforementioned methods include an additional separate process to ensure a desired optical characteristic of the inverse wavelength dispersion retardation films.

SUMMARY

An embodiment provides an inverse wavelength dispersion retardation film, an optical characteristic of which is efficiently adjustable.

Another embodiment relates to a display with high image quality using the inverse wavelength dispersion retardation film.

An embodiment provides a retardation film including: a first optical anisotropic layer including a polymer material; and a second optical anisotropic layer including a liquid crystal material, in which the first optical anisotropic layer has refractive indices which satisfy the following inequation: $nz1 \geq nx1 > ny1$, in which $nx1$ denotes a refractive index of the first optical anisotropic layer in a direction of a slow axis thereof, $ny1$ denotes a refractive index of the first optical anisotropic layer in a direction of a fast axis thereof, and $nz1$ is a refractive index of the first optical anisotropic layer in a thickness direction, which is substantially vertical to the slow axis direction and the fast axis direction of the first optical anisotropic layer, the second optical anisotropic layer has refractive indices which satisfy the following inequation: $nx2 > ny2 \geq nz2$, in which $nx2$ denotes a refractive index of the second optical anisotropic layer in a direction of a slow axis, $ny2$ denotes a refractive index of the second optical anisotropic layer in a direction of a fast axis thereof, and $nz2$ is a refractive index of the second optical anisotropic layer in a thickness direction, which is substantially vertical to the slow axis direction and the fast axis direction of the second optical anisotropic layer. In such an embodiment, the fast axis of the first optical anisotropic layer and the slow axis of the second optical anisotropic layer form a predetermined angle such that refractive indices of the retardation film satisfy the following inequation: $0 < (nx0-nz0)/(nx0-ny0) < 1$, in which $nx0$ denotes refractive index of the retardation film in a slow axis thereof, $ny0$ denotes a refractive index of the retardation film in a fast axis thereof, and $nz0$ denotes a refractive index of the retardation film in a thickness direction thereof, and in-plane retardation values of the retardation film respectively at a wavelength of about 450 nanometers, 550 nanometers and 650 nanometers satisfy the following inequation: $Re0 (450 nm) < Re0 (550 nm) < Re0 (650 nm)$, in which $Re0 (450 nm)$ denotes an in-plane retardation value of the retardation film at the wavelength of about 450 nanometers, $Re0 (550 nm)$ denotes an in-plane retardation value of the retardation film at the wavelength of about 550 nanometers, and $Re0 (650 nm)$ denotes an in-plane retardation value of the retardation film at the wavelength of about 650 nanometers.

In an embodiment, an in-plane retardation value of the first optical anisotropic layer and an in-plane retardation value of the second optical anisotropic layer may satisfy the following inequations: $150 \text{ nanometers} \leq Re1 (550 nm) \leq 400 \text{ nanometers}$, and $0 < Re1 (550 nm) - Re2 (550 nm) \leq \lambda/4$, in which $Re1 (550 nm)$ denotes the in-plane retardation value of the first optical anisotropic layer at the wavelength of about 550 nanometers, $Re2 (550 nm)$ denotes the in-plane retardation value of the second optical anisotropic layer at the wavelength of about 550 nanometers, and $\lambda$ is a value satisfying the following inequation: $130 \text{ nanometers} \leq \lambda/4 \leq 150 \text{ nanometers}$.

In an embodiment, the in-plane retardation value of the second optical anisotropic layer at the wavelength of 550 nanometers may be about 100 nanometers or more.

In an embodiment, an angle formed by an elongation direction of the first optical anisotropic layer and an alignment direction of the second optical anisotropic layer may be in a range of about 1° to about 41°.

In an embodiment, the first optical anisotropic layer may include polystyrene, poly(styrene-co-maleic anhydride), a polystyrene-based polymer, a polymaleimide-based polymer, a polymethacrylic acid-based polymer, a polyacrylonitrile-based polymer, a polymethyl methacrylate-based polymer, a cellulose ester-based polymer, a copolymer thereof, or a combination thereof.

In an embodiment, the second optical anisotropic layer may include a photo-crosslinked reactive liquid crystal.

In an embodiment, the reactive liquid crystal may include a rod type aromatic derivative including one or more reactive crosslinking groups, 1-methylpropylene glycol, propylene glycol 2-acetate, a compound represented by P1–A1–(Z1–A2)n–P2, or a combination thereof, where P1 and P2 are each independently an acrylate group, a methacrylate group, a vinyl group, a vinyloxy group and an epoxy group, A1 and A2 each are independently a 1,4-phenylene group and a naphthalene-2,6-diyl group, Z1 is —C(=O)O—, —OC(=O)— or a single bond, and n is 0, 1 or 2.

In an embodiment, the retardation film may further include a support film disposed between the first optical anisotropic layer and the second optical anisotropic layer and a liquid crystal alignment layer disposed between the support film and the second optical anisotropic layer.

In an embodiment, the support film may include triacetyl cellulose, polyethylene terephthalate, polycarbonate, acrylate, polyimide, or a combination thereof.

In an embodiment, the retardation film may further include a liquid crystal alignment layer disposed between the first optical anisotropic layer and the second optical anisotropic layer.

In an embodiment, the in-plane retardation values of the retardation film respectively at a wavelength of about 450 nanometers and 550 nanometers may satisfy the following inequation: 0.7<Re0 (450 nm)/Re0 (550 nm)≤1.0.

In an embodiment, the in-plane retardation values of the retardation film respectively at a wavelength of about 550 nanometers and 650 nanometers may satisfy the following inequation: 1.0≤Re0 (650 nm)/Re0 (550 nm)<1.2

In an embodiment, the polymer material may have a negative birefringence characteristic, and the liquid crystal material may have a positive birefringence characteristic.

Another exemplary embodiment provides an organic light emitting device including: an organic light emitting panel; an embodiment of the retardation film disposed in an emission direction of light emitted from the organic light emitting panel; and a polarizing device disposed outside the retardation film in the emission direction of light emitted from the organic light emitting panel, in which the second optical anisotropic layer is disposed between the organic light emitting panel and the first optical anisotropic layer, and the direction of the slow axis of the retardation film and an absorption axis of the polarizing device form an angle in a range of about 40° to about 50°.

In an embodiment, an angle formed by an elongation direction of the first optical anisotropic layer and an alignment direction of the second optical anisotropic layer may be in a range of about 1° to about 41°.

In an embodiment, the in-plane retardation values of the retardation film respectively at a wavelength of about 450 nanometers and 550 nanometers may satisfy the following inequation: 0.7<Re0 (450 nm)/Re0 (550 nm)≤1.0.

In an embodiment, the in-plane retardation values of the retardation film respectively at a wavelength of about 550 nanometers and 650 nanometers may satisfy the following inequation: 1.0≤Re0 (650 nm)/Re0 (550 nm)<1.2.

DETAILED DESCRIPTION

Figure 1:
FIG. 1 is a cross-sectional view of an inverse wavelength dispersion retardation film according to an exemplary embodiment.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, will be described in further detail with reference to the accompanying drawings.

First, an inverse wavelength dispersion retardation film according to an exemplary embodiment will be described with reference to FIG. 1.

FIG. 1 is a cross-sectional view of the inverse wavelength dispersion retardation film according to the exemplary embodiment.

An embodiment of the inverse wavelength dispersion retardation film includes a first optical anisotropic layer 1 comprising a polymer material (hereinafter, "polymer film") having a negative birefringence value, an adhesion layer 71, a second optical anisotropic layer including a liquid crystal material 2 (hereinafter, "liquid crystal film") having a positive birefringence value, a liquid crystal alignment layer 4 and a support film 3. Herein, the inverse wavelength dispersion retardation means that a retardation value to light having a long wavelength is greater than a retardation value to light having a short wavelength.

In such an embodiment, the inverse wavelength dispersion retardation means when an in-plane retardation value (Re0) defined as $Re0=(nx0-ny0)\times d$ (here, nx0 denotes a refractive index in a direction of a slow axis (slow axis direction) of the film, ny0 denotes a refractive index in a direction of a fast axis (fast axis direction) of the film, and d denotes a thickness of the film), the in-plane retardation value satisfies the following inequation: Re0 (450 nm)<Re0 (550 nm)<Re0 (650 nm), in which Re0 (450), Re0 (550), and Re0 (650) denote an in-plane retardation value of the inverse wavelength dispersion retardation film at the wavelength of 450 nanometers (nm), 550 nm and 650 nm, respectively. The inverse wavelength dispersion retardation film may have an in-plane retardation value (Re0) that satisfies the following inequation: $0 \text{ nm} \leq Re0 \leq 500 \text{ nm}$. In one embodiment, for example, the in-plane retardation value (Re0) of the inverse wavelength dispersion retardation film may be in a range of about 50 nm to about 400 nm, or in a range of about 100 nm to about 300 nm. In such an embodiment, the inverse wavelength dispersion retardation film may have an in-plane retardation value (Re0) at the wavelength of 450 nm and 550 nm that satisfies the following inequation: 0.1<Re0 (450)/Re0 (550)≤1.0. In one embodiment, for example, the in-plane retardation value (Re0) of the inverse wavelength dispersion retardation film at the wavelength of 450 nm and 550 nm may satisfy the following inequation: 0.5<Re0 (450)/Re0 (550)≤1.0, or 0.7<Re0 (450)/Re0 (550)≤1.0. In such an embodiment, the inverse wavelength dispersion retardation film may have an in-plane retardation value (Re0) at the wavelength of 550 nm and 650 nm that satisfies the following inequation: 1.0≤Re0 (650)/Re0 (550)<2.0. In one embodiment, for example, the in-plane retardation value (Re0) of the inverse wavelength dispersion retardation film at the wavelength of 550 nm and 650 nm may satisfy the following inequation: 1.0≤Re0 (650)/Re0 (550)<1.5, or 1.0≤Re0 (650)/Re0 (550)<1.2.

In an embodiment, the inverse wavelength dispersion retardation film may have an out-of-plane retardation value (Rth) defined by an equation of $Rth0=[(nx0+ny0)/2-nz0]\times d$ (where, nx0 denotes the refractive index in the slow axis direction of the film, ny0 denotes the refractive index in the fast axis direction of the film, nz0 denotes a refractive index in a thickness direction of the film, and d is the thickness of the film). In such an embodiment, the inverse wavelength dispersion retardation film may have the out-of-plane retardation value (Rth) that satisfies the following inequation: −200 nm≤Rth≤200 nm. In one embodiment, for example, the inverse wavelength dispersion retardation film may have the out-of-plane retardation value (Rth) that satisfies the following inequation: y−100 nm≤Rth≤100 nm or −50 nm≤Rth≤50 nm.

In such an embodiment, the inverse wavelength dispersion retardation film may have an Nz value (Nz0) that satisfies the following equation: $Nz0=Rth0/Re0+0.5=(nx0-nz0)/(nx0-ny0)$. In such an embodiment, the Nz value (Nz0) of the inverse wavelength dispersion retardation film may satisfy the following inequation: 0.01≤Nz≤3.0. In one embodiment, for example, the Nz value (Nz0) of the inverse wavelength dispersion retardation film may be in a range of about 0.1 to about 2.0, or in a range of about 0.2 to about 1.0.

In an embodiment, the polymer film 1 having a negative birefringence property has the birefringence property by elongating the polymer film, and is a polymer film where the refractive index of light in an elongation direction is less than the refractive index of light in a direction that is substantially perpendicular to the elongation direction. In such an embodiment, the refractive index of the polymer film 1 satisfies the following inequation: $nz1 \geq nx1 > ny1$, where nx1 denotes the refractive index of the polymer film 1 in a direction where the in-plane refractive index is the greatest (in the slow axis direction), ny1 denotes the refractive index of the polymer film 1 in a direction where the in-plane refractive index is the smallest (in the fast axis direction), nz1 denotes the refractive index of the polymer film 1 in a thickness direction. Here, ny1 may be the refractive index of the polymer film 1 in the elongation direction.

General definition of the negative birefringence of a film is as follows.

Where the birefringence (Δn) of the film is represented by the equation of $\Delta n = ne - no$, the film has a negative birefringence if the birefringence (Δn) of the film satisfies the following inequation: Δn<0. Here, ne denotes a refractive index of the film in a parallel direction to an optical axis, and no denotes a refractive index of the film in a vertical direction to the optical axis.

In an embodiment, the polymer film 1 having the negative birefringence property is a polymer film where the slow axis and the fast axis are defined or formed substantially in the vertical and horizontal directions to an alignment direction of a polymer main chain, respectively.

In an embodiment, the polymer film 1 has an in-plane retardation value (Re1), an out-of-plane retardation value (Rth1), and an Nz value (Nz1) defined as follows.

① Re1: The in-plane retardation value (in-plane phase difference) may be defined by the following equation: $Re1 = (nx1-ny1)\times d1$, where nx denote the refractive index in the slow axis direction of the film, ny denotes the refractive index in the fast axis direction of the film, and d denotes the thickness of the polymer film 1 in micrometer (μm).

In an embodiment, the polymer film 1 may have the in-plane retardation value (Re1) that satisfies the following inequation: 0 nm≤Re≤600 nm. In one embodiment, for example, the in-plane retardation value (Re1) of the polymer film 1 may be in a range of about 50 nm to about 500 nm, or in a range of about 100 nm to about 400 nm.

②  Rth1: The out-of-plane retardation value (thickness direction phase difference) may be defined by the following equation: $Rth1=[(nx1+ny1)/2-nz1] \times d1$, where nx1 denotes the refractive index in the slow axis direction of the film, ny1 denotes the refractive index in a direction of the fast axis direction of the film, nz1 denotes a refractive index in the thickness direction of the film, and d1 denotes the thickness (μm) of the polymer film 1.

In an embodiment, the polymer film 1 may have the out-of-plane retardation value (Rth1) that satisfies the following inequation: $-400 \text{ nm} \leq Rth1 \leq 0 \text{ nm}$. In one embodiment, for example, the out-of-plane retardation value (Rth) of the polymer film 1 may be in a range of about −300 nm to about −30 nm, or in a range of about −200 nm to about −50 nm.

③ Nz1: the Nz value (Nz1) of the polymer film 1 may be defined by the following equation: $Nz1=(nx1-nz1)/(nx1-ny1)=(Rth1/Re1)+0.5$.

In an embodiment, the polymer film 1 may have the Nz value that satisfies the following inequation: $1.0 < Nz1 \leq 3.0$. In one embodiment, for example, the Nz value of the polymer film may be in a range of about 1.05 to about 2.5, or in a range of about 1.1 to about 2.0.

In an embodiment, the polymer film 1 may include a material having the negative birefringence value. In one embodiment, for example, the material of the polymer film 1 may include polystyrene, poly(styrene-co-maleic anhydride), a polystyrene-based polymer, a polymaleimide-based polymer, a polymethacrylic acid-based polymer, a polyacrylonitrile-based polymer, a polymethyl methacrylate-based polymer, a cellulose ester-based polymer, a copolymer thereof, or a combination thereof. In such an embodiment, the material of the polymer film 1 may be a blend compound where two or more of the negative birefringence polymers are blended. The polymer film 1 may have a positive wavelength dispersion retardation characteristic. Here, the positive wavelength dispersion retardation characteristic means a characteristic that birefringence is reduced as the wavelength of light is increased, that is, a characteristic represented by the following inequation: $Re1 (450) > Re1 (550) > Re1 (650)$. Herein, Re1 (450), Re1 (550), and Re1 (650) denote the in-plane phase retardation value (Re1) of the polymer film 1 at the wavelength of 450 nm, 550 nm and 650 nm, respectively. In such an embodiment, the polymer film 1 may have the in-plane phase retardation value (Re1) at the wavelength of 450 nm 550 nm and 650 nm that satisfy the following inequation: $1.0 < Re1 (450)/Re1 (550) \leq 2.0$. In one embodiment, for example, the polymer film 1 may have the in-plane phase retardation value (Re1) at the wavelength of 450 nm 550 nm and 650 nm that satisfy the following inequation: $1.0 < Re1 (450)/Re1 (550) \leq 1.5$, or $1.0 < Re1 (450)/Re1 (550) \leq 1.3$. In such an embodiment, the polymer film 1 may have the in-plane phase retardation value (Re1) at the wavelength of 550 nm and 650 nm that satisfy the following inequation: $0.5 \leq Re1 (650)/Re1 (550) < 1.0$. In one embodiment, for example, the polymer film 1 may have the in-plane phase retardation value (Re1) at the wavelength of 550 nm and 650 nm that satisfy the following inequation: $0.7 \leq Re1 (650)/Re1 (550) < 1.0$, or $0.8 \leq Re1 (650)/Re1 (550) < 1.0$.

Physical properties of an embodiment of the polymer film 1 are as follows.

Molecular Weight:

A number average molecular weight (Mn) of the polymer film 1 may satisfy the following inequation: $10,000 \leq Mn \leq 300,000$. In one embodiment, for example, the number average molecular weight (Mn) of the polymer film 1 may be in a range of about 30,000 to about 200,000, or in a range of about 50,000 to about 100,000.

A weight average molecular weight (Mw) of the polymer film 1 may satisfy the following inequation: $10,000 \leq Mw \leq 1,000,000$. In one embodiment, for example, the weight average molecular weight (Mw) of the polymer film 1 may be in a range of about 50,000 to about 800,000, or in a range of about 100,000 to about 500,000.

A molecular weight distribution of the polymer film 1, e.g., polydispersity index ("PDI") of the polymer film 1, which is represented by Mw/Mn, may satisfy the following inequation: $1.0 \leq PDI \leq 13.0$. In one embodiment, for example, the PDI of the polymer film 1 may be in a range of about 1.0 to about 2.5, or in a range of about 1.0 to about 2.0.

② Melting point (Tm): The melting point of the polymer film 1 may be in a range of about 100° C. to about 500° C. In one embodiment, for example, the melting point of the polymer film 1 may be in a range of about 150° C. to about 400° C., or in a range of about 200° C. to about 300° C.

③ Glass transition temperature (Tg): The glass transition temperature of the polymer film 1 may be in a range of about 25° C. to about 300° C. In on embodiment, for example, the glass transition temperature of the polymer film 1 may be in a range of about 80° C. to about 250° C., or in a range of about 100° C. to about 200° C.

④ Refractive index(n): The refractive index of the polymer film 1 may be in a range of about 1.4 to about 2.0. In one embodiment, for example, the refractive index of the polymer film 1 may be in a range of about 1.45 to about 1.9, or in a range of about 1.5 to about 1.8.

In an embodiment, the polymer film 1 may be manufactured by extruding a polymer material having such a characteristic at a predetermined temperature using an extruder to perform molding in a film form, and elongating the film at a temperature around the glass transition temperature using an elongation machine.

In an embodiment, the support film 3 includes a material having substantially high transparency, mechanical strength, and optical isotropy, such as triacetyl cellulose ("TAC"). The support film 3 is a film layer that supports the liquid crystal alignment layer or the liquid crystal, and may have a predetermined retardation value (phase difference) for improving or maintaining the characteristics of the entire laminated film, e.g., the inverse wavelength dispersion retardation film. The support film 3 may have an in-plane retardation value (Re3) that satisfies the following inequation: $0 \text{ nm} \leq Re3 \leq 100 \text{ nm}$. In one embodiment, for example, the in-plane retardation value (Re3) of the support film 3 may be in a range of about zero (0) nm to about 50 nm, or in a range of about zero (0) nm to about 10 nm. In such an embodiment, the support film 3 may have an out-of-plane retardation value (Rth3) that satisfies the following inequation: $0 \text{ nm} \leq Rth3 \leq 100 \text{ nm}$. In one embodiment, for example, the out-of-plane retardation value (Rth3) of the support film 3 may be in a range of about zero (0) nm to about 80 nm, or in a range of about zero (0) nm to about 50 nm.

The liquid crystal alignment layer 4 may include polyimide, polyimidic acid, or the like. In such an embodiment, the liquid crystal alignment layer 4 may be a layer provided by aligning the liquid crystal in the liquid crystal film 2 in a predetermined direction. The liquid crystal alignment layer 4 has a structure for aligning the liquid crystal, the structure may be provided by a method such as rubbing or nanoimprinting. In an embodiment, the liquid crystal alignment layer 4 may have optical isotropy. In an alternative embodiment, the liquid crystal alignment layer 4 may have a phase difference within a predetermined range, thereby substantially not affecting the characteristics of the entire laminated film, e.g., the inverse wavelength dispersion retardation film. The liquid crystal alignment layer 4 may have an in-plane retardation value (Re4) that satisfies the following inequation: 0 nm≤Re≤430 nm. In one embodiment, for example, the in-plane retardation value (Re4) of the liquid crystal alignment layer 4 may be in a range of about zero (0) nm to about 20 nm, or in a range of about zero (0) nm to about 10 nm. In such an embodiment, the liquid crystal alignment layer 4 may have an out-of-plane retardation value that satisfies the following inequation: 0 nm≤Rth4≤50 nm. In one embodiment, for example, the out-of-plane retardation value (Rth4) of the liquid crystal alignment layer may be in a range of about zero (0) nm to about 30 nm, or in a range of about zero (0) nm to about 10 nm.

In an embodiment, the liquid crystal film 2 has the birefringence property provided by aligning the liquid crystal in a predetermined direction, and has a positive birefringence characteristic, that is, the refractive index of the liquid crystal film 2 in a direction where the liquid crystal is aligned (optical axis direction of the liquid crystal) is greater than the refractive index of the liquid crystal film 2 in a direction that is substantially perpendicular to the liquid crystal alignment direction. In such an embodiment, the refractive index of the liquid crystal film 2 satisfies the following inequation: nx2>ny2≥nz2, where nx2 denotes the refractive index of the liquid crystal film 2 in the slow axis direction, which is a direction where the in-plane refractive index is the greatest, ny2 denotes the refractive index of the liquid crystal film 2 in the fast axis direction, which is a direction where the in-plane refractive index is smallest, nz2 denotes the refractive index of the liquid crystal film 2 in the thickness direction, which is substantially vertical to the directions of nx2 and ny2. Here, Ny2 may be the refractive index of the liquid crystal film 2 in the alignment direction. General definition of the positive birefringence is as follows.

Where the birefringence Δn of crystal film is represented by the equation of Δn=ne−no, the film has a positive birefringence if the birefringence (Δn) of the film satisfies the following inequation: Δn>0. Here, ne denotes a refractive index of the film in a parallel direction to an optical axis, and no denotes a refractive index of the film in a vertical direction to the optical axis.

In an embodiment, the liquid crystal film 2 is a liquid crystal film where the fast axis and the slow axis are respectively defined as directions that are vertical and horizontal to the alignment direction of a liquid crystal main chain.

The liquid crystal film 2 has an in-plane retardation value (Re2), an out-of-plane retardation value (Rth2), and an Nz value (Nz2) defined as follows.

① Re2: The in-plane phase retardation value (in-plane phase difference) may be defined by the following equation: Re2=(nx2−ny2)×d2, where nx2 denotes the refractive index in the slow axis direction of the liquid crystal film 2, ny2 is the refractive index in the fast axis direction of the liquid crystal film 2, and d2 is the thickness (μm) of the liquid crystal film 2.

The in-plane phase retardation value (Re2) of the liquid crystal film 2 may be in a range of about zero (0) nm to about 500 nm. In one embodiment, for example, the in-plane phase retardation value (Re2) of the liquid crystal film 2 may be in a range of about 50 nm to about 400 nm, or in a range of about 100 nm to about 300 nm.

② Rth2: The out-of-plane retardation value (thickness direction phase difference) may be defined by the following equation: Rth2=[(nx2+ny2)/2−nz2]×d2, where nx2 denotes the refractive index in the slow axis direction of the liquid crystal film 2, ny2 denotes the refractive index in the fast axis direction of the liquid crystal film 2, nz2 denotes the thickness direction refractive index of the liquid crystal film 2, and d2 denotes the thickness of the liquid crystal film 2.

In an embodiment, the out-of-plane retardation value (Rth2) of the liquid crystal film 2 may be in a range of about zero (0) nm to about 500 nm. In one embodiment, for example, the out-of-plane retardation value (Rth2) of the liquid crystal film 2 may be in a range of about 50 nm to about 400 nm, or in a range of about 100 nm to about 300 nm.

③ Nz2: the Nz value of the liquid crystal film 2 may be defined by the following equation: Nz2=(nx2−nz2)/(nx2−ny2)=(Rth2/Re2)+0.5.

The liquid crystal film may have the Nz value in the range of about 1.0 to about 3.0. In one embodiment, for example, the Nz value of the liquid crystal film may be in a range of about 1.05 to about 2.5, or in a range of about 1.1 to about 2.0.

In an embodiment, the liquid crystal film 2 may include a photo-crosslinked reactive liquid crystal (e.g., a photo-crosslinked reactive mesogen), which is photo-crosslinked through radiation of ultraviolet rays, and the like. The reactive mesogen is photo-crosslinked or optically coupled by rays such as ultraviolet rays, and a material aligned according to an alignment state of adjacent materials. In one embodiment, for example, the reactive mesogen may include a rod type aromatic derivative having one or more reactive crosslinking groups, 1-methylpropylene glycol, propylene glycol 2-acetate, a compound represented by the following equation, and the like:

$$P1-A1-(Z1-A2)n-P2,$$

In the equation above, P1 and P2 are each independently an acrylate group, a methacrylate group, a vinyl group, a vinyloxy group, or an epoxy group, A1 and A2 are each independently a 1,4-phenylene group or a naphthalene-2,6-diylgroup, Z1 is —C(=O)O—, —OC(=O)—, or a single bond, and n is 0, 1 or 2.

The liquid crystal film 2 may have a positive wavelength dispersion retardation characteristic. As described above, the positive wavelength dispersion retardation characteristic means a characteristic that birefringence is reduced as the wavelength of light is increased, that is, a characteristic represented by the following inequation: Re2 (450)>Re2 (550)>Re2 (650). Herein, Re2 (450), Re2 (550) and Re2 (650) denote the in-plane phase retardation value (Re2) of the liquid crystal film 2 at the wavelength of 450 nm, 550 nm and 650 nm, respectively. The liquid crystal film 2 may have the in-plane phase retardation value (Re2) at the wavelength of 450 nm and 550 nm that satisfy the following inequation: 1.0<Re2 (450)/Re2 (550)≤2.0. In one embodiment, for example, the liquid crystal film 2 may have the in-plane phase retardation value (Re2) at the wavelength of 450 nm and 550 nm that satisfy the following inequation: 1.0<Re2 (450)/Re2 (550)≤1.5, or 1.0<Re2 (450)/Re2 (550)≤1.3. In such an embodiment, the liquid crystal film 2 may have the in-plane phase retardation value (Re2) at the wavelength of 550 nm and 650 nm that satisfy the following inequation: 0.5≤Re2 (650)/Re2 (550)<1.0. In one embodiment, for example, the liquid crystal film 2 may have the in-plane phase retardation value (Re2) at the wavelength of 550 nm and 650 nm that satisfy the following inequation: $0.7 \leq Re2$ $(650)/Re2 (550)<1.0$, or $0.8 \leq Re2 (650)/Re2 (550)<1.0$.

In an embodiment, the liquid crystal film 2 is manufactured by dissolving the rod type reactive liquid crystals in a solvent such as a solution including a mixture of toluene and cyclohexanone to manufacture a reactive liquid crystal solution, thinly applying the reactive liquid crystal solution on the liquid crystal alignment layer 4 that is subjected to rubbing treatment and performing drying to remove the solvent, and then radiating ultraviolet rays to photo-crosslink the reactive liquid crystals. In such an embodiment, where the liquid crystal film 2 may have weak mechanical strength, the liquid crystal film 2 may be disposed, e.g., coated, on the support film 3. In an embodiment, where the photo-alignment layer is used instead of rubbing the liquid crystal alignment layer 4, an alignment direction of the liquid crystal may be determined by adjusting a direction of the ultraviolet radiation. In an embodiment, where the nano-imprinted alignment layer is used instead of rubbing the liquid crystal alignment layer 4, the alignment direction of the liquid crystal may be adjusted by manufacturing an alignment mold at a predetermined angle and performing pressing.

In an embodiment, the liquid crystal film 2 disposed on the support film 3 may be bonded to the polymer film 1 by an adhesion layer 71. In such an embodiment, the polymer film 1 and the liquid crystal alignment layer 4 are disposed in predetermined directions such that the elongation direction of the polymer film 1 (hereinafter, referred to as "elongation direction") and the rubbing direction of the liquid crystal alignment layer 4 (hereinafter, referred to as the "liquid crystal alignment direction") form a predetermined angle ($\phi$). The angle ($\phi$) formed by the elongation direction (corresponding to the fast axis of the polymer film 1) and the liquid crystal alignment direction (corresponding to the slow axis of the liquid crystal film 2) may be differently adjusted according to a wavelength dispersion characteristic to be implemented. In an embodiment, the angle ($\phi$) formed by the elongation direction (corresponding to the fast axis of the polymer film 1) and the liquid crystal alignment direction (corresponding to the slow axis of the liquid crystal film 2) may be in a range of about $-90°$ to about $90°$. In one embodiment, for example, the angle ($\phi$) formed by the elongation direction and the liquid crystal alignment direction may be in a range of about $-60°$ to about $60°$, or in a range of about $-45°$ to about $45°$.

In an embodiment, where the inverse wavelength dispersion retardation film is a $\lambda/4$ phase difference film, which is used as an antireflection film of the organic light emitting display, the polymer film 1 and the liquid crystal film 2 disposed on the support film 3 may be combined with a predetermined angle therebetween such that the in-plane phase retardation value of the combined film at the wavelength of 550 nm may be in a range of about 130 nm to about 150 nm.

The polymer film 1 and the liquid crystal film 2 each cause a predetermined phase difference to light passing therethrough. In an embodiment, the phase difference caused by the polymer film 1 and the liquid crystal film 2 may also be differently adjusted according to the wavelength dispersion characteristic to be implemented. In an embodiment, where the inverse wavelength dispersion retardation film has the inverse wavelength dispersion characteristic, the in-plane phase retardation value (Re1) of the polymer film 1 at the wavelength of 550 nm may be in a range of about 150 nm to about 400 nm, and the liquid crystal film 2 may have an in-plane phase retardation value (Re2) that satisfies the following inequation: $0<Re1-Re2\lambda/4$. Herein, $\lambda$ is a value adjacent to 550 nm, and is a value satisfying the following inequation: $130 \text{ nm} \leq \lambda/4 \leq 150 \text{ nm}$. Hereinafter, Experimental Examples showing the wavelength dispersion characteristic according to the phase difference of the polymer film 1 and the liquid crystal film 2 and the angle ($\phi$) formed by the elongation direction and the liquid crystal alignment direction will be described with reference to the following Tables 1 to 6.

In Tables 1 to 3 shown below, the negative birefringence polymer films each causing the phase differences of about 94 nm, about 124 nm, about 153 nm, about 173 nm, about 193 nm, about 213 nm, about 233 nm, about 253 nm, about 263 nm, and about 273 nm to light having the wavelength of about 550 nm were manufactured, the positive birefringence liquid crystal films each causing the phase differences of about 48 nm, about 104 nm, about 115 nm, about 122 nm, about 131 nm, about 140 nm, about 153 nm, and about 191 nm to light having the wavelength of about 550 nm were manufactured, and the phase difference, the wavelength dispersion, and the Nz value (also referred to as "Nz coefficient") of the combined films were measured while variously setting the combinations thereof. Herein, the Nz value (Nz) is a coefficient represented by the following equation: $Nz=(nx-nz)/(nx-ny)$, in which nx denotes the refractive index in an x-axis direction, ny denotes the refractive index in an y-axis direction, and nz denotes the refractive index in a z-axis (e.g., thickness direction). In an embodiment, where the inverse wavelength dispersion retardation film is a film to be applied to a liquid crystal display device, the Nz value may be set to be about 0.5, such that viewing angles of the liquid crystal display device in all directions are substantially uniformly improved.

In Experimental Examples, the negative birefringence polymer film was manufactured by extruding poly(styrene-co-maleic anhydride) using an extruder at a temperature of about 250° C. to perform molding in a film form, and uniaxially elongating the molded film using the elongation machine at a predetermined temperature (T) in a range of about ±20° C. based on the glass transition temperature (Tg) (e.g., $Tg-20° C.<T<Tg+20° C.$) at an elongation ratio in a range of about 1% to about 100%. The positive birefringence liquid crystal film was manufactured in a form coated on the TAC film to have a thickness in a range of about 1 µm to about 5 µm by dissolving the rod type reactive liquid crystals in a solution including a mixture of toluene and cyclohexanone to manufacture a reactive liquid crystal solution, applying the reactive liquid crystal solution in a thickness of about 5 um or less on the TAC film that is subjected to rubbing treatment, drying the coated TAC film at a temperature between about 60° C. and about 70° C. for about 1 minute to 3 minutes to remove a residual solvent, and then radiating ultraviolet rays to photo-crosslink the reactive liquid crystals. The manufactured negative birefringence polymer film and positive birefringence liquid crystal film were laminated and bonded through the adhesion film, the condition satisfying the inverse wavelength dispersion and Nz<1.0 was confirmed by variously adjusting the angle ($\phi$) formed by the elongation direction of the polymer film and the alignment direction of the liquid crystal, but in the following Tables, the phase difference of about $\lambda/4$ was representatively exhibited as the phase difference of the combined film, and the combination angle, the wavelength dispersion and the Nz value according to the phase difference were exhibited.

The in-plane retardation value or phase difference (Re), the out-of-plane retardation value or phase difference (Rth), the wavelength dispersion, and the Nz coefficient of the film were measured using an Axoscan equipment (Axomatrix Inc.), and the refractive index of the film was measured using a prism coupler equipment (Metricon Corporation). The in-plane refractive index (nx, ny), the out-of-plane (e.g., thickness direction) refractive index (nz), the direction where the in-plane refractive index is largest, that is, the slow axis, and the direction where the in-plane refractive index is smallest, that is, the fast axis of the film may be measured by scanning the film using the Axoscan equipment while rotating the film at an azimuth angle of 0° to 360°.

TABLE 1

| Phase difference of the polymer film | Phase difference of the liquid crystal film | Combination angle | Phase difference of the combined film | Wavelength dispersion of the combined film Re (450/550) | Wavelength dispersion of the combined film Re (650/550) | Nz of the combined film |
|---|---|---|---|---|---|---|
| 94 nm | 48 nm | Inverse wavelength dispersion cannot be implemented at any angle | | | | |
| | 104 nm | Inverse wavelength dispersion cannot be implemented at any angle | | | | |
| | 131 nm | Inverse wavelength dispersion cannot be implemented at any angle | | | | |
| | 153 nm | Inverse wavelength dispersion cannot be implemented at any angle | | | | |
| | 191 nm | Inverse wavelength dispersion cannot be implemented at any angle | | | | |
| 124 nm | 48 nm | Inverse wavelength dispersion cannot be implemented at any angle | | | | |
| | 104 nm | Inverse wavelength dispersion cannot be implemented at any angle | | | | |
| | 131 nm | Inverse wavelength dispersion cannot be implemented at any angle | | | | |
| | 153 nm | Inverse wavelength dispersion cannot be implemented at any angle | | | | |
| | 191 nm | Inverse wavelength dispersion cannot be implemented at any angle | | | | |
| 153 nm | 48 nm | Inverse wavelength dispersion cannot be implemented at any angle | | | | |
| | 104 nm | 35° | 140 nm | 0.992 | 1.000 | 0.950 |
| | 115 nm | 33° | 141 nm | 0.991 | 1.001 | 0.714 |
| | 122 nm | 35° | 143 nm | 0.995 | 1.001 | 0.714 |
| | 131 nm | 31° | 75 nm | 0.996 | 1.009 | 0.745 |
| | 140 nm | 30° | 140 nm | 0.997 | 1.005 | 0.913 |
| | 153 nm | Inverse wavelength dispersion cannot be implemented at any angle | | | | |
| | 191 nm | Inverse wavelength dispersion cannot be implemented at any angle | | | | |

TABLE 2

| Phase difference of the polymer film | Phase difference of the liquid crystal film | Combination angle | Phase difference of the combined film | Wavelength dispersion of the combined film Re (450/550) | Wavelength dispersion of the combined film Re (650/550) | Nz of the combined film |
|---|---|---|---|---|---|---|
| 173 nm | 48 nm | Inverse wavelength dispersion cannot be implemented at any angle | | | | |
| | 104 nm | Inverse wavelength dispersion cannot be implemented at any angle | | | | |
| | 115 nm | 21° | 145 nm | 0.975 | 1.005 | 0.577 |
| | 122 nm | 27° | 141 nm | 0.966 | 1.009 | 0.605 |
| | 131 nm | 31° | 140 nm | 0.965 | 1.010 | 0.652 |
| | 140 nm | 38° | 143 nm | 0.992 | 1.008 | 0.738 |
| | 153 nm | 40° | 138 nm | 0.995 | 1.005 | 0.712 |
| | 191 nm | Inverse wavelength dispersion cannot be implemented at any angle | | | | |
| 193 nm | 48 nm | Inverse wavelength dispersion cannot be implemented at any angle | | | | |
| | 104 nm | Inverse wavelength dispersion cannot be implemented at any angle | | | | |
| | 115 nm | 15° | 140 nm | 0.990 | 1.005 | 0.405 |
| | 122 nm | 25° | 142 nm | 0.992 | 1.003 | 0.428 |
| | 131 nm | 27° | 141 nm | 0.980 | 1.011 | 0.532 |
| | 140 nm | 30° | 142 nm | 0.970 | 1.015 | 0.605 |
| | 153 nm | 35° | 144 nm | 0.965 | 1.018 | 0.712 |
| | 191 nm | 41° | 146 nm | 0.991 | 1.001 | 0.641 |
| 213 nm | 48 nm | Inverse wavelength dispersion cannot be implemented at any angle | | | | |
| | 104 nm | 15° | 145 nm | 0.915 | 1.010 | 0.357 |
| | 115 nm | 10° | 140 nm | 0.901 | 1.015 | 0.464 |
| | 122 nm | 13° | 143 nm | 0.905 | 1.015 | 0.502 |
| | 131 nm | 23° | 152 nm | 0.881 | 1.031 | 0.579 |
| | 140 nm | 25° | 146 nm | 0.867 | 1.040 | 0.642 |
| | 153 nm | 27° | 143 nm | 0.901 | 1.021 | 0.714 |
| | 191 nm | 33° | 145 nm | 0.989 | 1.008 | 1.002 |
| 233 nm | 48 nm | Inverse wavelength dispersion cannot be implemented at any angle | | | | |
| | 104 nm | Inverse wavelength dispersion cannot be implemented at any angle | | | | |
| | 115 nm | 8° | 142 nm | 0.905 | 1.015 | 0.457 |
| | 122 nm | 13° | 143 nm | 0.885 | 1.035 | 0.532 |
| | 131 nm | 15° | 140 nm | 0.865 | 1.044 | 0.579 |
| | 140 nm | 19° | 145 nm | 0.850 | 1.066 | 0.648 |
| | 153 nm | 27° | 141 nm | 0.874 | 1.038 | 0.821 |
| | 191 nm | 39° | 141 nm | 0.985 | 1.009 | 1.114 |

TABLE 3

| Phase difference of the polymer film | Phase difference of the liquid crystal film | Combination angle | Phase difference of the combined film | Wavelength dispersion of the combined film Re (450/550) | Wavelength dispersion of the combined film Re (650/550) | Nz of the combined film |
|---|---|---|---|---|---|---|
| 253 nm | 48 nm | Inverse wavelength dispersion cannot be implemented at any angle | | | | |
|  | 104 nm | Inverse wavelength dispersion cannot be implemented at any angle | | | | |
|  | 115 nm | Inverse wavelength dispersion cannot be implemented at any angle | | | | |
|  | 122 nm | 11° | 143 nm | 0.895 | 1.031 | 0.428 |
|  | 131 nm | 15° | 144 nm | 0.866 | 1.010 | 0.524 |
|  | 140 nm | 18° | 140 nm | 0.831 | 1.085 | 0.584 |
|  | 153 nm | 21° | 142 nm | 0.842 | 1.060 | 0.642 |
|  | 191 nm | 29° | 141 nm | 0.961 | 1.005 | 0.928 |
| 263 nm | 48 nm | Inverse wavelength dispersion cannot be implemented at any angle | | | | |
|  | 104 nm | Inverse wavelength dispersion cannot be implemented at any angle | | | | |
|  | 115 nm | Inverse wavelength dispersion cannot be implemented at any angle | | | | |
|  | 122 nm | 1° | 141 nm | 0.991 | 1.000 | 0.356 |
|  | 131 nm | 15° | 140 nm | 0.815 | 1.093 | 0.428 |
|  | 140 nm | 18° | 143 nm | 0.775 | 1.085 | 0.528 |
|  | 153 nm | 20° | 142 nm | 0.783 | 1.090 | 0.605 |
|  | 191 nm | 25° | 141 nm | 0.937 | 1.012 | 0.805 |
| 273 nm | 48 nm | Inverse wavelength dispersion cannot be implemented at any angle | | | | |
|  | 104 nm | Inverse wavelength dispersion cannot be implemented at any angle | | | | |
|  | 115 nm | Inverse wavelength dispersion cannot be implemented at any angle | | | | |
|  | 122 nm | Inverse wavelength dispersion cannot be implemented at any angle | | | | |
|  | 131 nm | 13° | 141 nm | 0.862 | 1.000 | 0.365 |
|  | 140 nm | 16° | 143 nm | 0.857 | 1.102 | 0.436 |
|  | 153 nm | 19° | 144 nm | 0.882 | 1.083 | 0.552 |
|  | 191 nm | 24° | 142 nm | 0.912 | 1.015 | 0.789 |

In Tables 1 to 3 above, the phase differences of the polymer film, the liquid crystal film and the combined film are phase differences which occur when light having the wavelength of 550 nm passes therethrough.

According to Tables 1 to 3, which show an experimental result, the polymer film (negative birefringence film) could implement the inverse wavelength dispersion characteristic from the phase difference of 153 nm. Considering the experimental error and the like, the phase difference (Re1) of the polymer film may be set to be about 150 nm or more to implement the inverse wavelength dispersion characteristic. The upper limit of the phase difference of the polymer film 1 may not be limited, but the phase difference or the in-plane retardation value of the polymer film may be set to be less than about 400 nm as shown in Tables 1 to 3. Accordingly, the in-plane retardation value (Re1) of the polymer film 1 may be set to be in a range of about 150 nm to about 400 nm.

The phase difference or the in-plane retardation value (Re2) of the liquid crystal film (positive birefringence film) may have a value satisfying the following inequation: $0 < Re1 - Re2 \lambda/4$, when the phase difference (Re1) of the polymer film is set. Herein, $\lambda$ is a value in a range of about 130 nm to about 150 nm. In an embodiment, the range of the phase difference (Re2) of the liquid crystal film is set based on the phase difference (Re1) of the polymer film, and the phase difference or the in-plane retardation value (Re2) of the liquid crystal film may be about 100 nm or more according to the experimental results of Tables 1 to 3.

The angle ($\phi$) formed by the elongation direction of the polymer film and the liquid crystal alignment direction of the liquid crystal film may be differently adjusted based on the wavelength dispersion characteristic to be implemented. In an embodiment, where the inverse wavelength dispersion retardation film is the $\lambda/4$ phase difference film used as the antireflection film of the organic light emitting display, the polymer film 1 and the liquid crystal film 2 on the support film 3 are combined with a predetermined angle therebetween such that the phase difference or the in-plane retardation value (Re0) of the combined film at the wavelength of 550 nm may be in a range of about 130 nm to about 150 nm.

According to the experimental results of Tables 1 to 3, the most cases where the combined film had the inverse wavelength dispersion characteristic may function as a $\lambda/4$ phase difference film. According to the experimental results of Tables 1 to 3, the angle ($\phi$) formed by the elongation direction of the polymer film and the liquid crystal alignment direction of the liquid crystal film was in a range of about 1° to about 41°. Herein, the angle ($\phi$) formed by the elongation direction of the polymer film and the liquid crystal alignment direction of the liquid crystal film may be a value measured based on either the elongation direction of the polymer film or the liquid crystal alignment direction of the liquid crystal film.

The following Table 4 shows data obtained by measuring the wavelength dispersion characteristic according to the angle ($\phi$) formed by the elongation direction and the liquid crystal alignment direction when the polymer film having the phase difference or the in-plane retardation value (Re) of about 213 nm and the liquid crystal film having the phase difference or the in-plane retardation value (Re) of about 131 nm are combined at various angles, The following Table 5 shows data obtained by measuring the wavelength dispersion characteristic according to the angle ($\phi$) formed by the elongation direction and the liquid crystal alignment direction when the polymer film having the phase difference or the in-plane retardation value (Re) of about 213 nm and the liquid crystal film having the phase difference or the in-plane retardation value (Re) of about 153 nm are combined at various angles, and the following Table 6 shows data obtained by measuring the wavelength dispersion characteristic according to the angle (ϕ) formed by the elongation direction and the liquid crystal alignment direction when the polymer film having the phase difference or the in-plane retardation value (Re) of about 213 nm and the liquid crystal film having the phase difference or the in-plane retardation value (Re) of about 191 nm are combined at various angles.

TABLE 4

| | | Wavelength dispersion | | |
|---|---|---|---|---|
| ϕ (°) | Re (nm) | Re (450/550) | Re (650/550) | Nz |
| −30 | 167.5 | 0.968 | 1.000 | 0.497 |
| −25 | 146 | 0.967 | 1.001 | 0.5 |
| −20 | 127.2 | 0.969 | 1.001 | 0.5 |
| −15 | 108.8 | 0.976 | 1.000 | 0.509 |
| −10 | 94 | 0.983 | 0.999 | 0.506 |
| −5 | 83.2 | 0.993 | 1.011 | 0.493 |
| 0 | 80.9 | 1.003 | 0.997 | 0.343 |
| 5 | 81.9 | 0.997 | 1.003 | 0.419 |
| 10 | 92.6 | 0.989 | 1.008 | 0.458 |
| 15 | 108.7 | 0.982 | 1.009 | 0.487 |
| 20 | 127.3 | 0.977 | 1.010 | 0.495 |
| 25 | 146.8 | 0.974 | 1.008 | 0.502 |
| 30 | 168.2 | 0.974 | 1.007 | 0.502 |

According to Table 4 above, when the polymer film having the phase difference or the in-plane retardation value (Re) of about 213 nm and the liquid crystal film having the phase difference or the in-plane retardation value (Re) of about 131 nm are bonded, an optical characteristic satisfying the inverse wavelength dispersion and Nz value in a range of about zero (0) to about 1.0 may be obtained at most angles (e.g., ϕ≥2°, ϕ≤−2°) with the exception of the range of −2°<ϕ<2°. In an embodiment, where the inverse wavelength dispersion retardation film is a film to be applied to the liquid crystal display device, when the Nz value is about 0.5, or the Nz value is in a range of about 0.4 to about 0.6, for example, the viewing angles of the liquid crystal display device in all directions are substantially uniformly improved, such that the inverse wavelength dispersion retardation film may be effectively used as the compensation film, the reflection reduction film, or the like. In such an embodiment, even when the Nz value is about 1.0 or less, viewing angle correction effect may be improved as compared to existing conventional elongation type reflection reduction film. Therefore, in an embodiment, when the Nz value is not in the range of about 0.4 to about 0.6, the inverse wavelength dispersion retardation film may be used as the optical film such as the compensation film or the reflection reduction film according to the optical characteristic to be implemented.

TABLE 5

| | | Wavelength dispersion | | |
|---|---|---|---|---|
| ϕ (°) | Re (nm) | Re (450/550) | Re (650/550) | Nz |
| −30 | 166.1 | 0.983 | 1.009 | 0.536 |
| −25 | 142.6 | 0.934 | 1.009 | 0.548 |
| −20 | 120.1 | 0.923 | 1.008 | 0.561 |
| −15 | 98.3 | 0.929 | 1.004 | 0.586 |
| −10 | 79.4 | 0.927 | 0.997 | 0.617 |
| −5 | 64.6 | 0.927 | 0.988 | 0.651 |
| 0 | 59 | 0.931 | 0.988 | 0.647 |
| 5 | 64.5 | 0.932 | 1.000 | 0.634 |
| 10 | 78.9 | 0.937 | 1.012 | 0.606 |

TABLE 5-continued

| | | Wavelength dispersion | | |
|---|---|---|---|---|
| ϕ (°) | Re (nm) | Re (450/550) | Re (650/550) | Nz |
| 15 | 97.2 | 0.938 | 1.019 | 0.574 |
| 20 | 119.9 | 0.939 | 1.020 | 0.566 |
| 25 | 142.4 | 0.942 | 1.020 | 0.548 |
| 30 | 167 | 0.945 | 1.018 | 0.545 |

According to Table 5 above, when the polymer film having the phase difference or the in-plane retardation value (Re) of about 213 nm and the liquid crystal film having the phase difference or the in-plane retardation value (Re) of about 153 nm are bonded, the optical characteristic satisfying the inverse wavelength dispersion and Nz value in the range of about 0 to about 1.0 may be obtained in the residual angle range (ϕ≥1°, ϕ≤−12°) with the exception of the range of −12°<ϕ<1°.

TABLE 6

| | | Wavelength dispersion | | |
|---|---|---|---|---|
| ϕ (°) | Re (nm) | Re (450/550) | Re (650/550) | Nz |
| −30 | 168 | 0.893 | 1.023 | 0.607 |
| −25 | 140.4 | 0.888 | 1.027 | 0.629 |
| −20 | 114 | 0.882 | 1.031 | 0.656 |
| −15 | 86.6 | 0.874 | 1.037 | 0.711 |
| −10 | 60.9 | 0.857 | 1.050 | 0.804 |
| −5 | 35.5 | 0.798 | 1.103 | 1.08 |
| 0 | 21.6 | 0.674 | 1.256 | 0.878 |
| 5 | 35.4 | 0.841 | 1.135 | 1.02 |
| 10 | 56.4 | 0.883 | 1.077 | 0.817 |
| 15 | 85.6 | 0.894 | 1.058 | 0.713 |
| 20 | 112.8 | 0.898 | 1.047 | 0.663 |
| 25 | 140.7 | 0.901 | 1.039 | 0.631 |
| 30 | 167.4 | 0.903 | 1.033 | 0.604 |

According to Table 6 above, when the polymer film having the phase difference or the in-plane retardation value (Re) of about 213 nm and the liquid crystal film having the phase difference (Re) or the in-plane retardation value of about 191 nm are bonded, the optical characteristic satisfying the inverse wavelength dispersion and Nz value in the range of about zero (0) to about 1.0 may be obtained even though ϕ is any angle.

According to the Experimental Example described above, the inverse wavelength dispersion retardation film having a predetermined optical characteristic may be efficiently implemented or manufactured by bonding the polymer film having the negative birefringence value and the liquid crystal film having the positive birefringence value.

It is ideal that the inverse wavelength dispersion retardation film for being used as the antireflection layer of the organic light emitting display causes the retardation of λ/4 to light in all wavelength ranges, and the film has the wavelength dispersion characteristic where Re0 (450/550) and Re0 (650/550) are about 0.81 and about 1.18, respectively. It was confirmed that two cases described in the following Table 7 are substantially close to an ideal wavelength dispersion characteristic.

TABLE 7

| Polymer film | | | | | Liquid crystal film | | | | | Combination angle | Phase difference of the combined film (nm) | Wavelength dispersion of the combined film | | Nz of the combined film |
|---|---|---|---|---|---|---|---|---|---|---|---|---|---|---|
| Re (nm) | Rth (nm) | nx | ny | nz | Re (nm) | Rth (nm) | nx | ny | nz | | | Re (450/550) | Re (650/550) | |
| 273 | −159 | 1.581 | 1.5775 | 1.5813 | 135 | 113 | 1.6025 | 1.5993 | 1.5981 | 15° | 139 | 0.85 | 1.08 | 0.32 |
| 263 | −161 | 1.5809 | 1.5776 | 1.5813 | 130 | 110 | 1.6024 | 1.5993 | 1.5982 | 15° | 143 | 0.81 | 1.1 | 0.35 |

As a result of measuring reflectance, a color shift, and the like by applying the retardation film to the organic light emitting display, in an embodiment, reflectance and the color shift may be substantially reduced as compared to a conventional retardation film.

Figure 2:
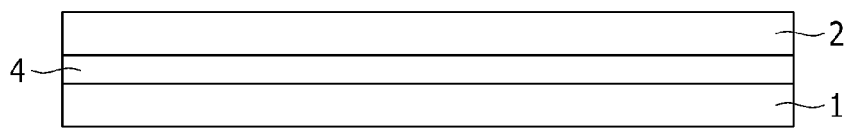
FIG. 2 is a cross-sectional view of an inverse wavelength dispersion retardation film according to another exemplary embodiment.

FIG. 2 is a cross-sectional view of an alternative embodiment of an inverse wavelength dispersion retardation film according to another exemplary embodiment.

The embodiment of the inverse wavelength dispersion retardation film shown in FIG. 2 is substantially the same as the embodiment of the inverse wavelength dispersion retardation film shown in FIG. 1 except for the support film 3 and the adhesion layer 71. In an embodiment, as shown in FIG. 2, the support film 3 and the adhesion layer 71 may be omitted, and the polymer film 1 having the negative birefringence value may support the liquid crystal film 2 having the positive birefringence value. In such an embodiment, the liquid crystal alignment layer 4 is disposed on the polymer film 1, and the liquid crystal film 2 is applied on the liquid crystal alignment layer 4.

Such an embodiment of the inverse wavelength dispersion retardation film shown in FIG. 2 may be manufactured by rubbing the polymer film 1, dissolving the rod type reactive liquid crystals in the solvent such as the solution including a mixture of toluene and cyclohexanone to manufacture the reactive liquid crystal solution, thinly applying the reactive liquid crystal solution on the liquid crystal alignment layer 4 that is provided, e.g., formed, on the polymer film 1 and is subjected to rubbing treatment, performing drying to remove the solvent, and then radiating ultraviolet rays to photo-crosslink the reactive liquid crystals. In an alternative embodiment, the liquid crystal polymer film may be converted into the liquid crystal alignment layer using a photo-alignment layer or a nano-imprinted alignment layer instead of rubbing the liquid crystal alignment layer 4. In an embodiment, where the photo-alignment layer is used, the alignment direction of the liquid crystal may be determined by adjusting the direction of the ultraviolet radiation. In an embodiment, where the nano-imprinted alignment layer is used, the alignment direction of the liquid crystal may be adjusted by manufacturing the alignment mold at a predetermined angle and performing pressing.

In an embodiment, the inverse wavelength dispersion retardation film may be manufactured by rubbing a separate support film, applying the reactive liquid crystal solution on the rubbed support film, performing drying, and radiating ultraviolet rays to photo-crosslink the reactive liquid crystals to form the liquid crystal film 2, and transferring the liquid crystal film 2 on the polymer film 1. In referring to FIG. 2, where the liquid crystal alignment layer 4 is omitted from the structure of FIG. 2, the liquid crystal film 2 may be directly provided, e.g., formed, on the polymer film 1.

The embodiment of the inverse wavelength dispersion retardation film of FIG. 2 has substantially the same optical characteristic as the embodiment of the inverse wavelength dispersion retardation film of FIG. 1. In such an embodiment, where the support film 3 is omitted, a material cost thereof may be reduced, and a thickness thereof may be further reduced.

Figure 3:
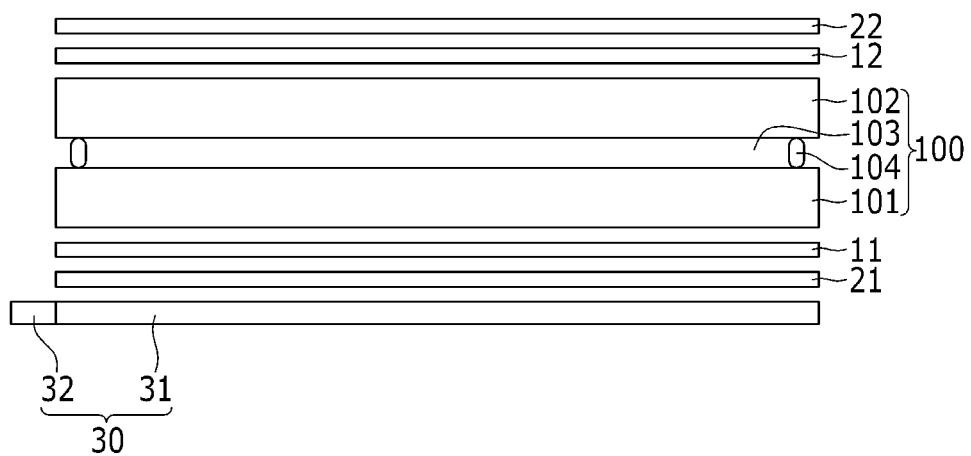
FIG. 3 is a cross-sectional view of an embodiment of a liquid crystal display device including the inverse wavelength dispersion retardation film of FIG. 1 or 2.

FIG. 3 is a cross-sectional view of an embodiment of a liquid crystal display device including the inverse wavelength dispersion retardation film shown in FIG. 1 or 2.

In an embodiment, the liquid crystal display device includes a liquid crystal panel 100 including upper and lower substrates 101 and 102, and a liquid crystal layer 103 interposed between the upper and lower substrates 101 and 102, and confined by a sealing material 104. In such an embodiment, a first compensation film 11 is disposed under the lower substrate 101, and a second compensation film 12 is disposed on the upper substrate 102. In such an embodiment, a first polarizing film 21 is disposed under the first compensation film 11, and a second polarizing film 22 is disposed on the second compensation film 12. The liquid crystal display device may include a backlight unit 30 including a light guide plate 31 and a light source 32, and disposed under the first polarizing film 21. In such an embodiment of the liquid crystal display device, at least one of the first compensation film 11 and the second compensation film 12 may be the inverse wavelength dispersion retardation film shown in FIG. 1 or 2. In an alternative embodiment, the first compensation film 11 or the second compensation film 12 may be omitted.

In an embodiment of the liquid crystal display device, the inverse wavelength dispersion retardation film may be used as a compensation film for improving viewing angle thereof.

Figure 4:
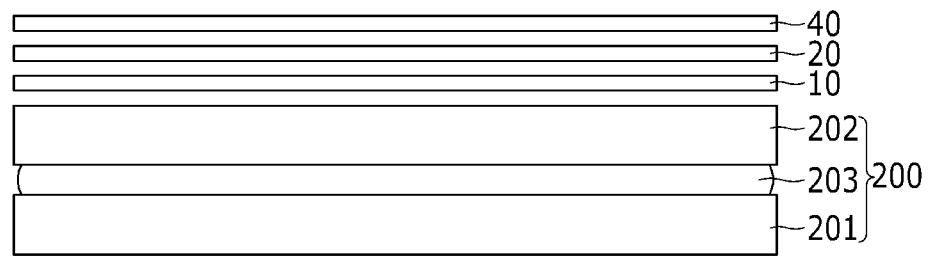
FIG. 4 is a cross-sectional view of an embodiment of an organic light emitting display including the inverse wavelength dispersion retardation film of FIG. 1 or 2.
Figure 5:
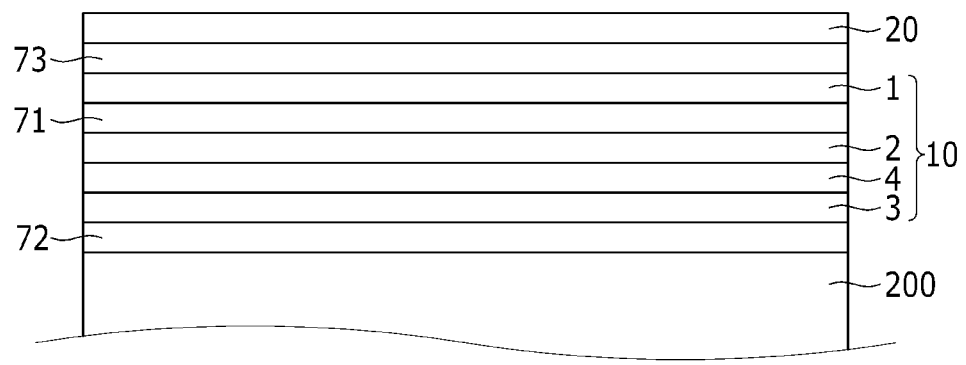
FIG. 5 is a cross-sectional view of the inverse wavelength dispersion retardation film shown in FIG. 4.

FIG. 4 is a cross-sectional view of an embodiment of an organic light emitting display including the inverse wavelength dispersion retardation film shown in FIG. 1 or 2, and FIG. 5 is a cross-sectional view of an inverse wavelength dispersion retardation film 10 in FIG. 4.

In an embodiment of the organic light emitting display, thin films including various kinds of circuit wires, such as a gate line, a data line, and a thin film transistor, and an organic light emitting layer 203 are disposed on a lower substrate 201, and the thin films and the organic light emitting layer 203 are covered with an upper substrate 202. The lower substrate 201, the thin films, the organic light emitting layer 203, and the upper substrate 202 collectively define an organic light emitting panel 200, and the inverse wavelength dispersion retardation film 10, a polarizing film 20, a passivation film 40, and the like are disposed, e.g., laminated, on the organic light emitting panel 200. In such an embodiment, the laminated inverse wavelength dispersion retardation film 10 and polarizing film 20 may function as an antireflection film.

Referring to FIG. 5, an embodiment of the inverse wavelength dispersion retardation film 10 includes the support film 3, the liquid crystal alignment layer 4, the liquid crystal film 2 having the positive birefringence characteristic, the adhesion layer 71 and the negative birefringence polymer film 1. In such an embodiment, the support film 3 is disposed on the organic light emitting panel 200 side, the polymer film 1 is disposed on the polarizing film 20 side, the organic light emitting panel 20 and the support film 3 are coupled or attached to each other by an adhesion layer 72, and the polarizing film 20 and the polymer film 1 are coupled or attached to each other by an adhesion layer 73. In such an embodiment, the slow axis of the inverse wavelength dispersion retardation film 10 and the absorption axis of the polarizing film 20 are disposed to form an angle in a range of about 40° to about 50° such that the inverse wavelength dispersion retardation film 10 converts light substantially linearly polarized by the polarizing film 20 into circularly polarized light to implement an antireflection function. In such an embodiment, where the slow axis of the inverse wavelength dispersion retardation film 10 and the absorption axis of the polarizing film 20 form the angle in the range of about 40° to about 50°, a retardation effect of the inverse wavelength dispersion retardation film 10 may be maximized to convert linear polarizing into circular polarizing.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A retardation film comprising:
   a first optical anisotropic layer comprising a polymer material; and
   a second optical anisotropic layer including a liquid crystal material,
   wherein
   the first optical anisotropic layer has refractive indices which satisfy the following inequation: $nz1 \geq nx1 > ny1$, wherein $nx1$ denotes a refractive index of the first optical anisotropic layer in a direction of a slow axis thereof, $ny1$ denotes a refractive index of the first optical anisotropic layer in a direction of a fast axis thereof, and $nz1$ is a refractive index of the first optical anisotropic layer in a thickness direction, which is substantially vertical to the slow axis direction and the fast axis direction of the first optical anisotropic layer,
   the second optical anisotropic layer has refractive indices which satisfy the following inequation: $nx2 > ny2 \geq nz2$, wherein $nx2$ denotes a refractive index of the second optical anisotropic layer in a direction of a slow axis, $ny2$ denotes a refractive index of the second optical anisotropic layer in a direction of a fast axis thereof, and $nz2$ is a refractive index of the second optical anisotropic layer in a thickness direction, which is substantially vertical to the slow axis direction and the fast axis direction of the second optical anisotropic layer,
   refractive indices of the retardation film satisfy the following inequation: $0<(nx0-nz0)/(nx0-ny0)<1$, wherein $nx0$ denotes refractive index of the retardation film in a slow axis thereof, $ny0$ denotes a refractive index of the retardation film in a fast axis thereof, and $nz0$ denotes a refractive index of the retardation film in a thickness direction thereof, the fast axis of the first optical anisotropic layer being an elongation direction of the first optical anisotropic layer and the slow axis of the second optical anisotropic layer being an alignment direction of the second optical anisotropic layer, and an angle between the elongation direction of the first optical anisotropic layer and the alignment direction of the second optical anisotropic layer is in a range of about 1° to about 41°, and
   in-plane retardation values of the retardation film respectively at a wavelength of about 450 nanometers, 550 nanometers and 650 nanometers satisfy the following inequation: Re0 (450 nm)<Re0 (550 nm)<Re0 (650 nm), wherein Re0 (450 nm) denotes an in-plane retardation value of the retardation film at the wavelength of about 450 nanometers, Re0 (550 nm) denotes an in-plane retardation value of the retardation film at the wavelength of about 550 nanometers, and Re0 (650 nm) denotes an in-plane retardation value of the retardation film at the wavelength of about 650 nanometers.

2. The retardation film of claim 1, wherein
an in-plane retardation value of the first optical anisotropic layer and an in-plane retardation value of the second optical anisotropic layer satisfy the following inequations: 150 nanometers≤Re1 (550 nm)≤400 nanometers, and 0<Re1 (550 nm)−Re2 (550 nm)≤λ/4, wherein Re1 (550 nm) denotes the in-plane retardation value of the first optical anisotropic layer at the wavelength of about 550 nanometers, Re2 (550 nm) denotes the in-plane retardation value of the second optical anisotropic layer at the wavelength of about 550 nanometers, and λ is a value satisfying the following inequation: 130 nanometers≤λ/4≤150 nanometers.

3. The retardation film of claim 2, wherein
the in-plane retardation value of the second optical anisotropic layer at the wavelength of 550 nanometers is about 100 nanometers or more.

4. The retardation film of claim 1, wherein
the first optical anisotropic layer comprises polystyrene, poly(styrene-co-maleic anhydride), a polystyrene-based polymer, a polymaleimide-based polymer, a polymethacrylic acid-based polymer, a polyacrylonitrile-based polymer, a polymethyl methacrylate-based polymer, a cellulose ester-based polymer, a copolymer thereof, or a combination thereof.

5. The retardation film of claim 4, wherein
the second optical anisotropic layer comprises a photo-crosslinked reactive liquid crystal.

6. The retardation film of claim 5, wherein
the cross-linked reactive liquid crystal comprises a rod type aromatic derivative comprising one or more reactive crosslinking groups, 1-methylpropylene glycol, propylene glycol 2-acetate, a compound represented by P1-A1-(Z1-A2)n-P2, or a combination thereof,
wherein P1 and P2 are each independently an acrylate group, a methacrylate group, a vinyl group, a vinyloxy group, or an epoxy group,
A1 and A2 are each independently a 1,4-phenylene group or a naphthalene-2,6-diyl group,
Z1 is COO—, OCO—, or a single bond, and
n is 0, 1, or 2.

7. The retardation film of claim 1, further comprising:
a support film disposed between the first optical anisotropic layer and the second optical anisotropic layer; and
a liquid crystal alignment layer disposed between the support film and the second optical anisotropic layer.

8. The retardation film of claim 7, wherein
the support film comprises triacetyl cellulose, polyethylene terephthalate, polycarbonate, acrylate, polyimide, or a combination thereof.

9. The retardation film of claim 1, wherein
the second optical anisotropic layer comprises a photo-crosslinked reactive liquid crystal.

10. The retardation film of claim 9, wherein
the cross-linked reactive liquid crystal comprises a rod type aromatic derivative comprising one or more reactive crosslinking groups, 1-methyl propylene glycol, propylene glycol 2-acetate, a compound represented by P1-A1-(Z1-A2)n-P2, or a combination thereof
wherein P1 and P2 are each independently an acrylate group, a methacrylate group, a vinyl group, a vinyloxy group or an epoxy group,
A1 and A2 are each independently a 1,4-phenylene group or a naphthalene-2,6-diyl group,
Z1 is —C(=O)O—, —OC(=O)— or a single bond, and n is 0, 1, or 2.

11. The retardation film of claim 1, further comprising:
a liquid crystal alignment layer disposed between the first optical anisotropic layer and the second optical anisotropic layer.

12. The retardation film of claim 1, wherein
the in-plane retardation values of the retardation film respectively at a wavelength of about 450 nanometers and 550 nanometers satisfy the following inequation: $0.7 < Re0\ (450\ nm)/Re0\ (550\ nm) \leq 1.0$.

13. The retardation film of claim 12, wherein
the in-plane retardation values of the retardation film respectively at a wavelength of about 550 nanometers and 650 nanometers satisfy the following inequation: $1.0 \leq Re0\ (650\ nm)/Re0\ (550\ nm) < 1.2$.

14. The retardation film of claim 1, wherein
the polymer material has a negative birefringence characteristic, and
the liquid crystal material has a positive birefringence characteristic.

15. An organic light emitting device comprising:
an organic light emitting panel;
the retardation film of claim 1 disposed in an emission direction of light emitted from the organic light emitting panel; and
a polarizing device disposed outside the retardation film in the emission direction of light emitted from the organic light emitting panel,
wherein
the second optical anisotropic layer is disposed between the organic light emitting panel and the first optical anisotropic layer, and
the direction of the slow axis of the retardation film and an absorption axis of the polarizing device form an angle in a range of about 40° to about 50°.

16. The organic light emitting device of claim 15, wherein
an in-plane retardation value of the first optical anisotropic layer and an in-plane retardation value of the second optical anisotropic layer satisfy the following inequations: $150\ \text{nanometers} \leq Re1\ (550\ nm) \leq 400\ \text{nanometers}$, and $0 < Re1\ (550\ nm) - Re2\ (550\ nm) \leq \lambda/4$, wherein Re1 (550 nm) denotes the in-plane retardation value of the first optical anisotropic layer at the wavelength of about 550 nanometers, Re2 (550 nm) denotes the in-plane retardation value of the second optical anisotropic layer at the wavelength of about 550 nanometers, and $\lambda$ is a value satisfying the following inequation: $130\ \text{nanometers} \leq \lambda/4 \leq 150\ \text{nanometers}$.

17. The organic light emitting device of claim 15, wherein
the in-plane retardation values of the retardation film respectively at a wavelength of about 450 nanometers and 550 nanometers satisfy the following inequation: $0.7 < Re0\ (450\ nm)/Re0\ (550\ nm) \leq 1.0$.

18. The organic light emitting device of claim 17, wherein
the in-plane retardation values of the retardation film respectively at a wavelength of about 550 nanometers and 650 nanometers satisfy the following inequation: $1.0 \leq Re0\ (650\ nm)/Re0\ (550\ nm) < 1.2$.

\* \* \* \* \*